(12) United States Patent
Channabasappa et al.

(10) Patent No.: US 7,211,887 B2
(45) Date of Patent: May 1, 2007

(54) CONNECTION ARRANGEMENT FOR MICRO LEAD FRAME PLASTIC PACKAGES

(75) Inventors: Eswarappa Channabasappa, Acton, MA (US); Richard Alan Anderson, North Attleborough, MA (US)

(73) Assignee: M/A-Com, Inc., Lowell, MA (US)

( * ) Notice: Subject to any disclaimer, the term of this patent is extended or adjusted under 35 U.S.C. 154(b) by 109 days.

(21) Appl. No.: 10/999,591

(22) Filed: Nov. 30, 2004

(65) Prior Publication Data

US 2006/0113646 A1    Jun. 1, 2006

(51) Int. Cl.
*H01L 23/52* (2006.01)
*H01L 23/48* (2006.01)

(52) U.S. Cl. .................. 257/691; 257/662; 257/663; 257/665; 257/670; 257/672; 257/690; 257/678; 257/728

(58) Field of Classification Search .................. None
See application file for complete search history.

(56) References Cited

U.S. PATENT DOCUMENTS

| | | | | |
|---|---|---|---|---|
| 4,172,261 | A  * | 10/1979 | Tsuzuki et al. | 257/717 |
| 5,422,664 | A  * | 6/1995 | Stephany | 347/14 |
| 6,566,601 | B2 * | 5/2003 | Maetani | 174/52.4 |
| 6,791,166 | B1 * | 9/2004 | Foster | 257/666 |
| 7,019,389 | B2 * | 3/2006 | Lai et al. | 257/666 |
| 7,026,664 | B2 * | 4/2006 | Divakar et al. | 257/107 |
| 2005/0285234 | A1* | 12/2005 | Kanno | 257/664 |
| 2006/0033188 | A1* | 2/2006 | Chen et al. | 257/678 |

* cited by examiner

*Primary Examiner*—Jasmine Clark

(57) ABSTRACT

A connection arrangement for a micro lead frame plastic (MLP) package is provided that includes a paddle configured to be connected to a circuit board and a first ground pad and a second ground pad each connected to the paddle. The first and second ground pads together with the paddle are configured to provide continuity of ground between the circuit board and a chip mounted to the paddle.

17 Claims, 3 Drawing Sheets

US 7,211,887 B2

CONNECTION ARRANGEMENT FOR MICRO LEAD FRAME PLASTIC PACKAGES

BACKGROUND OF THE INVENTION

This invention relates generally to micro lead frame plastic (MLP) packages, and more particularly, to a connection arrangement for MLP packages.

At RF, microwave and millimeter-wave frequencies, plastic packages are preferred because of the low cost and ease of manufacturing. For example, lead frames are much lower in cost compared to substrates used in Ball Grid Array packages. However, as the operating frequency increases, the effect of the package on the component/circuit overall RF performance becomes increasingly important. In addition to good electrical characteristics, when designing a package, it is also important to consider thermal dissipation path, space requirements or limitations, environmental protection and component reliability.

The use of plastic packages is currently limited to low frequency applications, for example, applications with a maximum frequency of about 5 GHz. This is due mainly to the parasitics (e.g., large inductance) associated with bond wire discontinuity of the chip-package-motherboard transition. These parasitics are particularly severe at higher frequencies, such as, for example, at 24 GHz. The parasitics are also caused by the use of a paddle and ground pads that are not connected and thereby fail to provide a continuity of ground, particularly at the higher frequencies. These parasitics result in high insertion loss, poor impedance matching and a large response over the required frequency band. The RF behavior of the chip-package-motherboard transition also results in a large power drop off with frequency.

The parasitic effects are sometimes overcome by including additional matching stubs on, for example, the Monolithic Microwave Integrated Circuit (MMIC) chip itself. However, as the space on the chip is often very limited, this on-chip matching can be complex and can be very expensive to implement. Moreover, using the matching stubs, the frequency bandwidth is very limited, making these configurations unacceptable for ultra broadband systems such as High Resolution Radar (HRR). Other solutions are also known and include using the parasitics for matching the amplifiers on the chip. However, these solutions also can be difficult to implement.

Flip-chip versions of MLP packages are also known for addressing the operating frequency problems. In these packages, a bumped die is flipped onto a lead frame paddle and then molded using a standard plastic package assembly process. Flip chip designs reduce signal inductance because the interconnect is much shorter when compared to a bond wire (e.g., 0.1 mm versus 1 mm). However, the manufacturing processes for such flip chip processes may not be satisfactory for mass production in large quantities.

Thus, known MLP packages either do not operate satisfactorily at higher frequencies or are complex and expensive to implement.

BRIEF DESCRIPTION OF THE INVENTION

According to an exemplary embodiment, a connection arrangement for a micro lead frame plastic (MLP) package is provided that includes a paddle configured to be connected to a circuit board and a first ground pad and a second ground pad each connected to the paddle. The first and second ground pads together with the paddle are configured to provide continuity of ground between the circuit board and a chip mounted to the paddle.

According to another exemplary embodiment, a micro lead frame plastic (MLP) package board is provided that includes a paddle configured to be grounded using a plurality of vias, an RF circuit, and a first ground pad and a second ground pad connected to the paddle. The first and second ground pads together with the paddle are configured to provide a continuous ground path between the RF circuit and a chip mounted to the paddle.

According to yet another exemplary embodiment, a method of connecting a micro lead frame plastic (MLP) package to a circuit board is provided. The method includes providing a paddle on the circuit board and configuring a first ground pad and a second ground pad of the circuit board to connect to the paddle to provide continuity of ground between the circuit board and a chip mounted to the paddle.

DETAILED DESCRIPTION OF THE INVENTION

Various embodiments of the invention provide a connection arrangement, and more particularly, wide-band transitions for use with micro lead frame plastic (MLP) packages, including with millimeter-wave MLP packages. These packages also are referred to as Quad Flat No-Lead (QFN) packages. The various embodiments include (i) matching circuits or arrangements that are either on a circuit board to which the MLP package is connected or on the lead frame itself and (ii) a lead frame configuration to compensate for bond wire inductance. In general, and as described in more detail herein, two pads, and specifically, two metal grounding pads on a motherboard connect paddle grounds to leads around an RF pad in a coplanar configuration. This arrangement provides a continuity of ground between the RF signal of the chip (e.g., integrated circuit (IC) chip) within the MLP package and the RF signal on the motherboard (e.g., RF board) to which the MLP package with chip is mounted.

Figure 1:
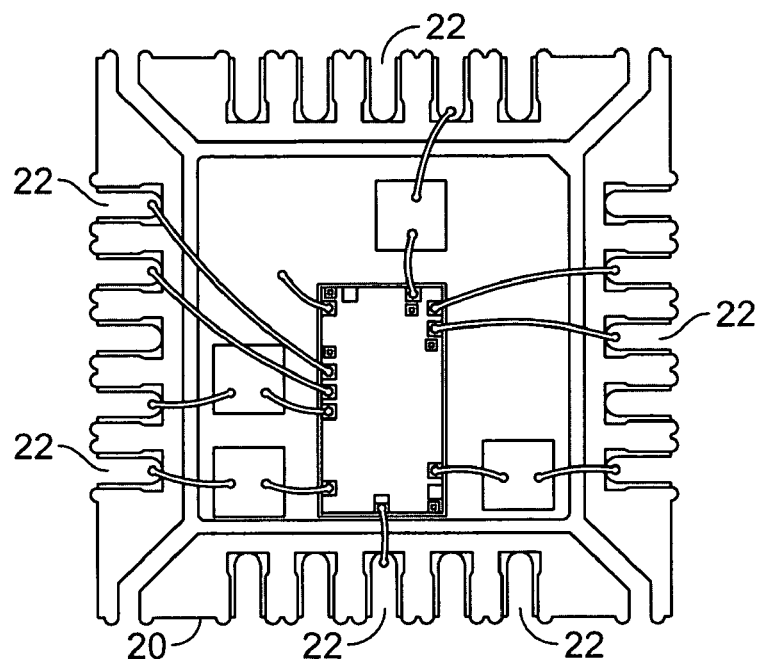
FIG. 1 is a block diagram of a micro lead frame (MLP) package in connection with which various embodiments of the present invention may be implemented.

More particularly, and as shown in FIG. 1, various embodiments of the present invention provide a connection arrangement for mounting a chip within an MLP package 20 having a plurality of leads 22 (e.g., copper leads). It should be noted that the size and shape of the MLP package 20 may be modified as desired or needed, for example, based on the size and shape of the chip to be mounted therein or the particular application or system in which the MLP package 20 is to be used. Additionally, the number and positioning of the leads 22 provided may be modified as desired or needed, for example, based on the chip to be mounted within the MLP package 20.

Figure 2:
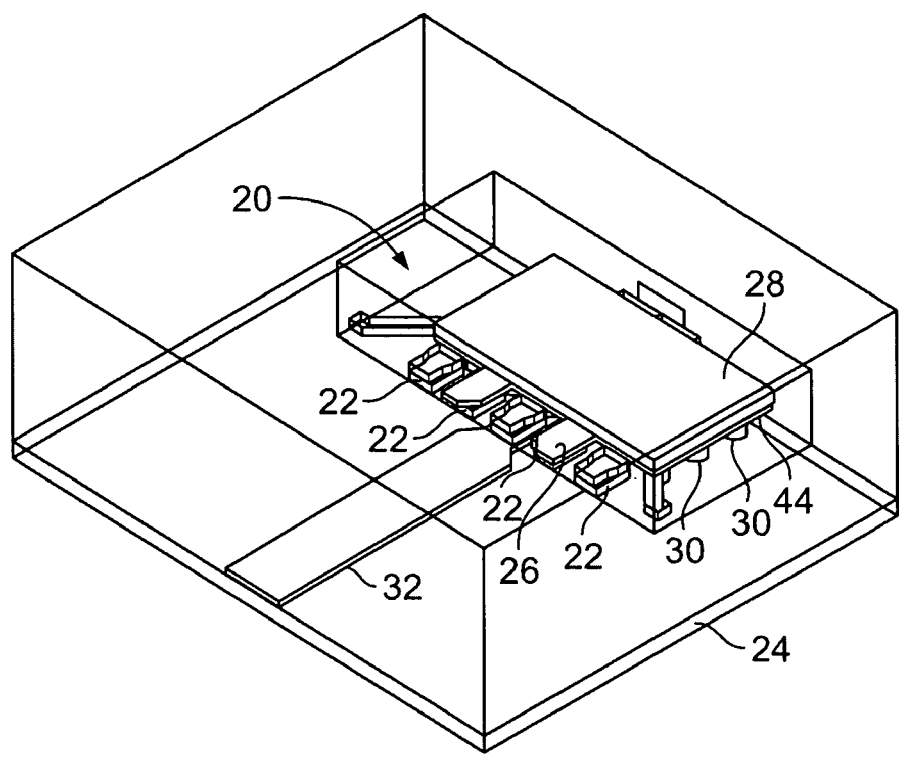
FIG. 2 is a perspective view of an MLP package mounted to a circuit board in accordance with an embodiment of the invention.
Figure 3:
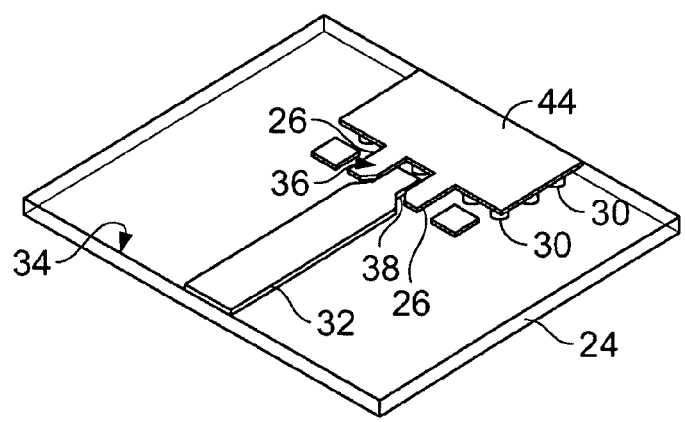
FIG. 3 is a perspective view of a circuit board layout in accordance with an embodiment of the invention for an MLP package.

Specifically, and as shown in FIGS. 2 and 3, in an exemplary embodiment, a connection arrangement is provided for an MLP package 20 that is to be mounted to a circuit board, such as, for example, a motherboard 24. In this embodiment, two ground pads 26 (shown more clearly in FIG. 3), such as, for example, copper pads on the motherboard 24, are connected to a paddle 28 (e.g., copper plate), sometimes referred to as a ground paddle, through a ground pad 44 (shown more clearly in FIG. 3). Thus, the paddle 28 may be mounted, for example, on top of the ground pad 44 using a soldering process. A plurality of vias 30 (e.g., copper connections) may be provided through the motherboard 24, for example, under the ground pad 44, to provide a common ground between the paddle 28 and the ground plane of the motherboard 24. The vias 30 may be hollow and metal plated or may be metal filled. The vias 30 also may provide a heat conduction path, for example, for heat generated in the MLP package 20 by and integrated circuit (IC) chip.

The ground pads 26 and paddle 28 may be constructed of any suitable material and configured in any suitable manner to provide a grounding connection, such as, for example, with copper traces. It should be noted that the number and size of the vias 30 may be modified as desired or needed, for example, based on the size and shape of the paddle 28. The ground pads 26 connect two of the leads 22 through the paddle 28 and the vias 30 to the motherboard 24 to provide a continuity of ground. In various embodiments, the ground pads 26 may be connected or integrated with the paddle 28 on the motherboard 24 in any suitable manner such that a continuity of ground is provided.

It should be noted that only a portion of the MLP package 20 is shown in FIGS. 2 and 3. Thus, additional leads 22, etc. may be provided as part of the MLP package 20.

Figure 4:
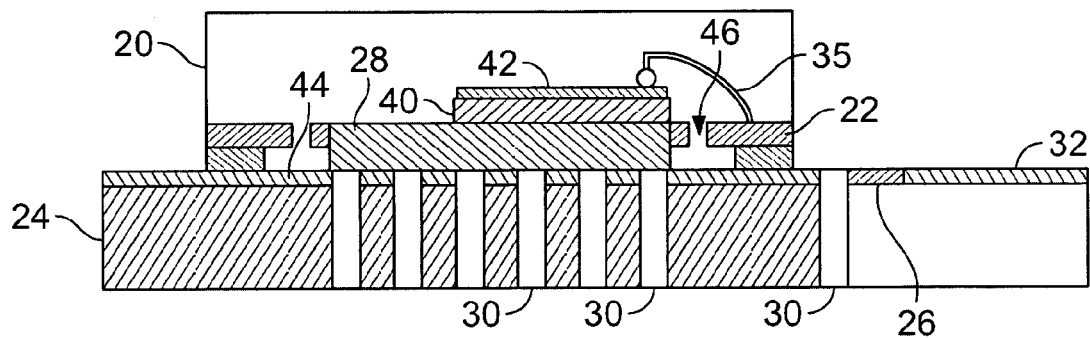
FIG. 4 is an elevational cross-sectional view of an MLP package mounted to a circuit board in accordance with an embodiment of the invention.
Figure 5:
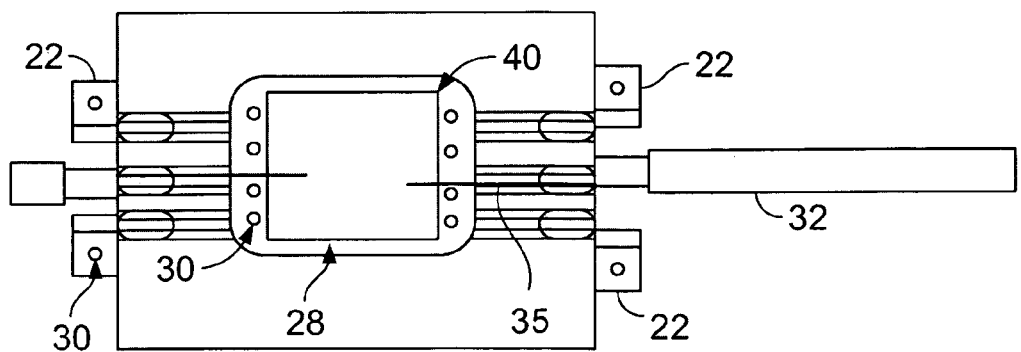
FIG. 5 is a plan schematic view of an MLP package mounted to a circuit board in accordance with an embodiment of the invention.
Figure 7:
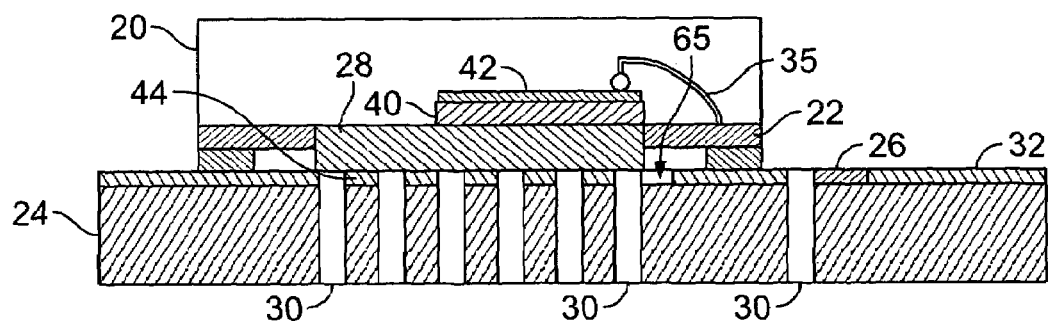
FIG. 7 is an elevational cross-sectional view of an MLP package mounted to a circuit board in accordance with another embodiment of the invention.

An RF line 32 (e.g., copper trace, microstrip line, etc.) or other RF circuit extends from an edge 34 of the motherboard 24 to a coplanar section 36 defined by the RF line 32 and the grounding pads 26. Further, the RF line 32 is connected to a chip 40 within the MLP package 20 through a lead 22 of the MLP package 20 using a bond wire 35 as shown more clearly in FIGS. 2 and 4. As shown in FIGS. 4 and 7, the chip 40 (e.g., GaAs IC, SiGe IC or CMOS IC) may be mounted to the paddle 28 in any manner as is known. A die coating 42 also may be provided to the chip 40 to protect the chip, for example, from the environment. Additionally, the paddle 28 is shown mounted to the ground pad 44 of the motherboard 24 using, for example, a soldering process. It should be noted that the motherboard 24 may be constructed of any suitable material or substrate.

Referring again to FIG. 3, the shape and size of the ground pads 26 and the space provided by a gap 38 between the RF line 32 and each of the ground pads 26 is configured such that a capacitance generated at the coplanar section 36 generally matches the inductance created by the bond wires 35 (shown in FIGS. 4 and 7). For example, a gap 38 of about 4 mils may be provided to provide a very good impedance match over a 30 GHz frequency band.

Figure 6:
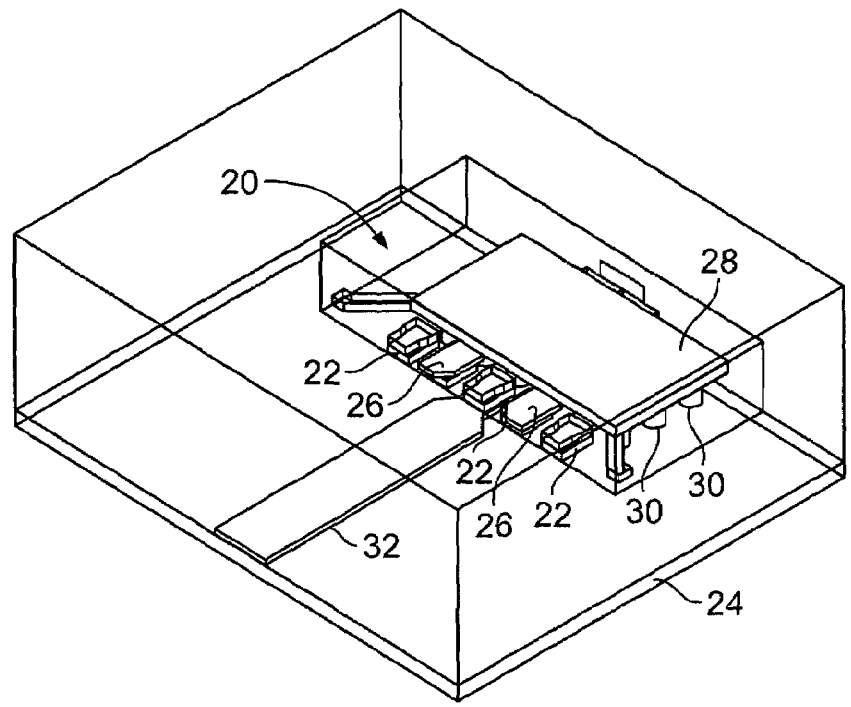
FIG. 6 is a perspective view of a circuit board layout in accordance with another embodiment of the invention for an MLP package.

In another embodiment of the invention as shown in FIGS. 6 and 7, instead of providing a chip-package-board interconnect on the motherboard 24 as shown in FIGS. 2 through 5, a connection only to the lead frame (e.g., directly to the leads 22) is provided. This configuration is similar to that shown in FIGS. 2 through 5, however, in this embodiment, the leads 22 are connected directly to the paddle 28 such that no gap 46 (as shown in FIG. 4) is provided between the leads 22 and the paddle 28. However, in this embodiment, there is a gap 65 between the between the RF line 32 and the ground pad 44.

In operation, continuity of ground is provided between an RF signal on the chip 40 and an RF signal on the motherboard 24. Specifically, the connection of the ground pads 26 directly to the paddle 28 provides this continuity of ground (i.e., a continuous ground path) from the RF line 32 to the ground on the motherboard 24 from the ground pads 26 to the paddle 28 and through the vias 30. Further, the coplanar configuration of the RF line 32 and the ground pads 26 creates a capacitance to match the inductance generated by the wire bonds 35 in the MLP package 20. The shape and arrangement of the RF line 32 and ground pads 26 in the coplanar section 36, and the size of the gap 38 between the RF line 32 and the ground pads 26 in the coplanar section 36 are configured as described herein to provide the matching.

Thus, various embodiments of the present invention provide a chip-package-motherboard transition, and more particularly, a grounding arrangement and matching configuration using a coplanar section allowing for improved operation of MLP packages, and specifically, plastic MLP packages, at higher frequency ranges. The configuration compensates for wire bond discontinuities by providing a continuity of ground between the RF line on the chip mounted in the MLP package and the RF line on the motherboard to which the MLP package is mounted. Improved scattering parameters of the transition between motherboard and MLP package, and reduced insertion losses are thereby provided. Further, constant power output at different frequency ranges is also provided.

Using various embodiments of the invention, an MLP package may be provided that can be used for applications at millimeter-wave frequencies. For example, the various embodiments of the present invention may be implemented to construct a 24 GHz MLP package for ultra-wideband frequency systems. Further, because the bandwidth of these transitions is very wide, MLP packages constructed according to the various embodiments of the invention can be used in different applications, for example in opto-electrical systems.

While the invention has been described in terms of various specific embodiments, those skilled in the art will recognize that the invention can be practiced with modification within the spirit and scope of the claims.

What is claimed is:

1. A connection arrangement for a micro lead frame plastic (MLP) package, the connection arrangement comprising:
    a paddle configured to be connected to a circuit board;
    a first ground pad and a second ground pad each connected to the paddle and together with the paddle configured to provide continuity of ground between the circuit board and a chip mounted to the paddle;
    a plurality of leads with at least a first lead configured to connect to the first ground pad and at least a second lead configured to connect to the second ground pad; and
    an RF line on the circuit board and wherein the RF line and first and second ground pads are configured in a coplanar configuration.

2. A connection arrangement in accordance with claim 1 further comprising an RF line on the circuit board and an RF line on the chip, and wherein the continuity of ground is provided between the RF line on the circuit board and the RF line on the chip.

3. A connection arrangement in accordance with claim 1 further comprising an RF line on the circuit board and at least one wire bond to connect the chip to the circuit board, and wherein the RF line and first and second ground pads are configured to generate a capacitance to match an inductance generated by the at least one wire bond.

4. A connection arrangement in accordance with claim 3 further comprising a gap between each of the first and second ground pads and the RF line.

5. A connection arrangement in accordance with claim 3 further comprising a gap between the paddle and the RF line.

6. A connection arrangement in accordance with claim 1 further comprising a third ground pad below the paddle and wherein the first and second ground pads are connected to the paddle through the third ground pad.

7. A connection arrangement in accordance with claim 1 wherein the first and second ground pads are connected to the paddle via leads of a lead from of the MLP package.

8. A connection arrangement in accordance with claim 1 wherein the first and second ground pads are each integrally formed on the circuit board with a third ground pad for connection to the paddle.

9. A connection arrangement in accordance with claim 1 further comprising a gap between the paddle and a lead of the MLP package, and wherein a wire bond connects the lead to the paddle.

10. A connection arrangement for a micro lead frame plastic (MLP) package, the connection arrangement comprising:
- a paddle configured to be connected to a circuit board;
- a first ground pad and a second ground pad each connected to the paddle and together with the paddle configured to provide continuity of ground between the circuit board and a chip mounted to the paddle;
- an RF line on the circuit board and wherein the RF line and the first and second ground pads are configured to provide a matching circuit and a gap is provided between each of the first and second ground pads and the RF line; and
- at least one wire bond to connect a chip to the circuit board, and wherein the RF line and first and second ground pads are configured to generate a capacitance to match an inductance generated by the at least one wire bond.

11. A micro lead frame plastic (MLP) package board comprising:
- a paddle configured to be grounded using a plurality of vias;
- an RF circuit; and
- a first ground pad and a second ground pad connected to the paddle through a third ground pad and together with the paddle configured to provide a continuous ground path between the RF circuit and a chip mounted to the paddle.

12. An MLP package board in accordance with claim 11 wherein the RF circuit and first and second ground pads are configured to generate a capacitance to match an inductance generated within the MLP package.

13. An MLP package board in accordance with claim 11 further comprising a wire bond to connect the RF circuit to a chip within the MLP package.

14. An MLP package board in accordance with claim 13 wherein the RF circuit and first and second ground pads are configured to generate a capacitance to match an inductance generated by the wire bond.

15. An MLP package board in accordance with claim 11 wherein the RF circuit and first and second ground pads are configured in a coplanar arrangement.

16. An MLP package board in accordance with claim 11 wherein the MLP package comprises leads and the ground pads are connected to the leads via a lead frame of the MLP package.

17. A method of connecting a micro lead frame plastic (MLP) package to a circuit board, the method comprising:
- providing a paddle on the circuit board;
- configuring a first ground pad and a second ground pad of the circuit board to connect to the paddle to provide continuity of ground between the circuit board and a chip mounted to the paddle; and
- configuring an RF circuit formed on the circuit board in a coplanar arrangement with the first and second ground pads.

* * * * *